United States Patent
Goodchild

(10) Patent No.: US 11,469,724 B2
(45) Date of Patent: Oct. 11, 2022

(54) FREE-BOOST CLASS-E AMPLIFIER

(71) Applicant: AIRA, Inc., Chandler, AZ (US)

(72) Inventor: Eric Heindel Goodchild, Phoenix, AZ (US)

(73) Assignee: AIRA, INC., Chandler, AZ (US)

( * ) Notice: Subject to any disclaimer, the term of this patent is extended or adjusted under 35 U.S.C. 154(b) by 220 days.

(21) Appl. No.: 17/103,940

(22) Filed: Nov. 24, 2020

(65) Prior Publication Data
US 2022/0149797 A1    May 12, 2022

Related U.S. Application Data

(60) Provisional application No. 63/111,618, filed on Nov. 9, 2020.

(51) Int. Cl.
| | | |
|---|---|---|
| *H03F 3/217* | (2006.01) | |
| *H02J 50/12* | (2016.01) | |
| *H02J 7/02* | (2016.01) | |

(52) U.S. Cl.
CPC .............. *H03F 3/2176* (2013.01); *H02J 7/02* (2013.01); *H02J 50/12* (2016.02)

(58) Field of Classification Search
CPC .. H03F 3/2176; H03F 2200/387; H03F 1/565; H03F 3/04; H03F 3/10; H03F 1/0244; H03F 1/0211; H03F 2200/504; H02J 7/02; H02J 50/12; H01L 29/00
See application file for complete search history.

(56) References Cited

U.S. PATENT DOCUMENTS

| | | | | |
|---|---|---|---|---|
| 6,198,260 B1* | 3/2001 | Wittenbreder | ........ | H02M 3/158 363/16 |
| 6,724,255 B2* | 4/2004 | Kee | ....................... | H03F 3/2176 330/251 |
| 7,760,018 B2* | 7/2010 | Ardehali | ............... | H03F 3/2171 330/251 |
| 9,929,704 B2* | 3/2018 | Mayo | ...................... | H03F 3/245 |
| 11,387,794 B2* | 7/2022 | Sasaya | .................. | H02M 7/493 |
| 2010/0253310 A1 | 10/2010 | Fonderie et al. | | |
| 2013/0093247 A1 | 4/2013 | Park et al. | | |
| 2015/0303806 A1 | 10/2015 | Madsen et al. | | |

(Continued)

OTHER PUBLICATIONS

PCT/US2021/058344. International Search Report and Written Opinion dated Feb. 1, 2022. (12 pages).

*Primary Examiner* — Khanh V Nguyen
(74) *Attorney, Agent, or Firm* — Loza & Loza, LLP; Anthony Smyth

(57) ABSTRACT

Systems, methods and apparatus for wireless charging are disclosed. A charging apparatus has an amplifier stage, a power switching stage and a controller. The amplifier stage has a choke that receives a current from an input of the amplifier stage, a resonant network coupled to an output of the choke and that provides an output current to a load, and a first switch configured to short the output of the choke to circuit ground when turned on. The power switching stage may be configured to couple a power supply to the input of the amplifier stage and may have a second switch operable to couple the input of the amplifier stage to circuit ground when turned on. The controller may be configured to control operation of the first switch and the second switch in accordance with a timing sequence that defines a cycle of the output current.

20 Claims, 13 Drawing Sheets

(56) References Cited

U.S. PATENT DOCUMENTS

| | | |
|---|---|---|
| 2017/0229921 A1 | 8/2017 | Hwang et al. |
| 2017/0271924 A1 | 9/2017 | Mao et al. |
| 2020/0244236 A1* | 7/2020 | Hwang .................. H02J 50/12 |

* cited by examiner

FREE-BOOST CLASS-E AMPLIFIER

PRIORITY CLAIM

This application claims priority to and the benefit of provisional patent application No. 63/111,618 filed in the United States Patent Office on Nov. 9, 2020 and the entire content of this provisional application is incorporated herein by reference as if fully set forth below in their entirety and for all applicable purposes.

TECHNICAL FIELD

The present invention relates generally to wireless charging of batteries, including batteries in mobile computing devices, and more particularly to controlling power transmitted to a chargeable device.

BACKGROUND

Wireless charging systems have been deployed to enable certain types of devices to charge internal batteries without the use of a physical charging connection. Devices that can take advantage of wireless charging include mobile processing and/or communication devices. Standards, such as the Qi standard defined by the Wireless Power Consortium enable devices manufactured by a first supplier to be wirelessly charged using a charger manufactured by a second supplier. Standards for wireless charging are optimized for relatively simple configurations of devices and tend to provide basic charging capabilities.

Improvements in wireless charging capabilities are required to support continually increasing complexity of mobile devices and changing form factors. For example, there is a need for improved power control for wireless power transmissions.

DETAILED DESCRIPTION

Figure 1:
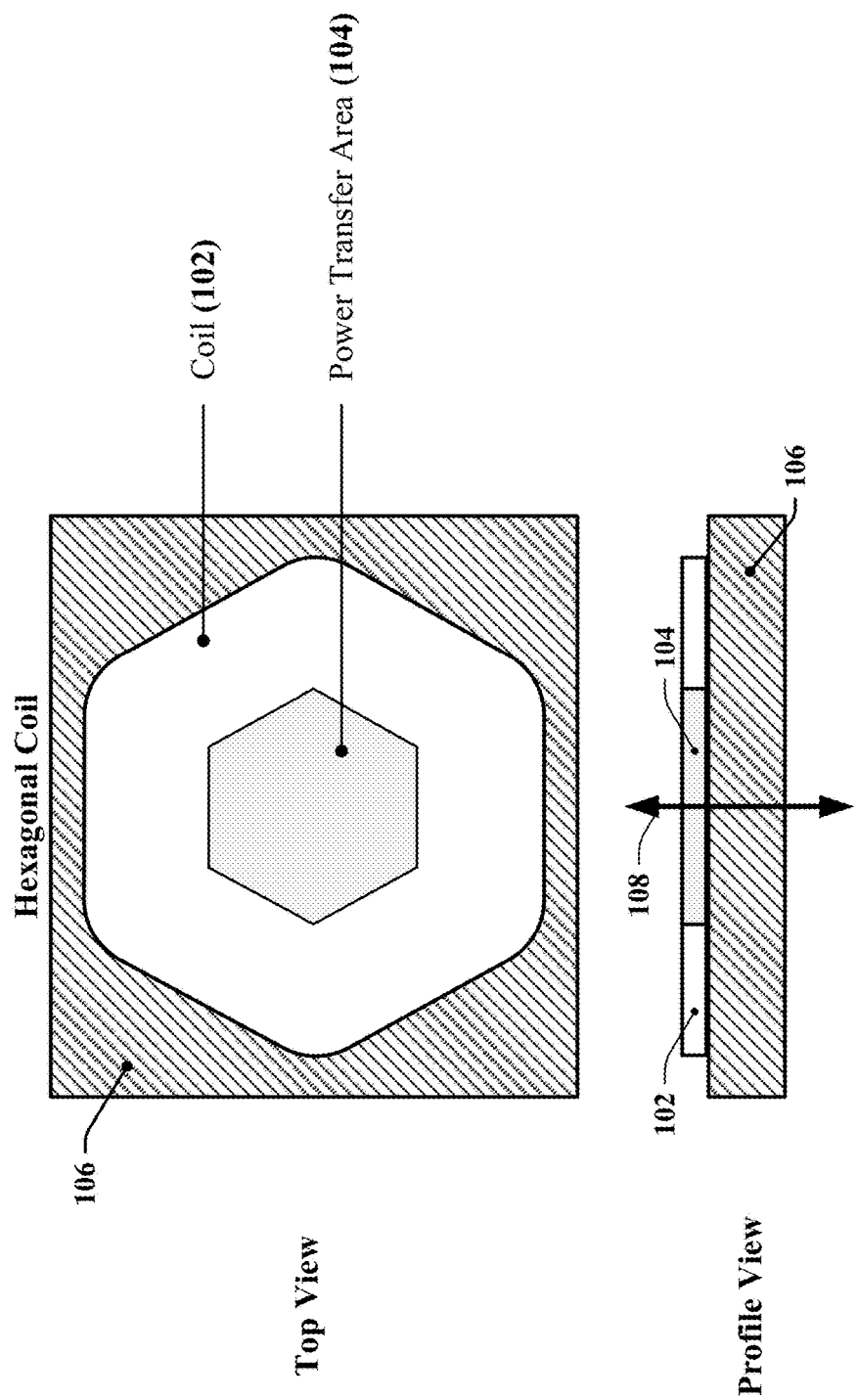
FIG. 1 illustrates an example of a charging cell that may be employed to provide a charging surface in accordance with certain aspects disclosed herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of wireless charging systems will now be presented with reference to various apparatus and methods. These apparatus and methods will be described in the following detailed description and illustrated in the accompanying drawing by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a processor-readable storage medium. A processor-readable storage medium, which may also be referred to herein as a computer-readable medium may include, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), Near Field Communications (NFC) token, random access memory (RAM), read only memory (ROM), programmable ROM (PROM), erasable PROM (EPROM), electrically erasable PROM (EEPROM), a register, a removable disk, a carrier wave, a transmission line, and any other suitable medium for storing or transmitting software. The computer-readable medium may be resident in the processing system, external to the processing system, or distributed across multiple entities including the processing system. Computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

Overview

Certain aspects of the present disclosure relate to systems, apparatus and methods applicable to wireless charging devices and techniques. Charging cells may be configured to include one or more inductive coils on the surface of a charging device, where the charging cells may be activated to charge one or more devices wirelessly. The location of a device to be charged may be detected through sensing techniques that associate location of a device to changes in a physical characteristic centered at a known location on a surface of the charging device. Sensing of location may be implemented using capacitive, resistive, inductive, touch, pressure, load, strain, and/or another appropriate type of sensing.

In one aspect of the disclosure, an apparatus has a battery charging power source, and at least one transmitting coil.

In another aspect of the disclosure, an apparatus has a battery charging power source, a plurality of charging cells configured in a matrix, where each charging cell in the plurality of charging cells can include one or more coils surrounding a power transfer area. The plurality of charging cells may be arranged adjacent to a surface of the device without overlap of power transfer areas of the charging cells in the plurality of charging cells. Devices placed on the surface may receive power that is wirelessly transmitted through one or more of the charging cells. In some instances, the apparatus may be referred to simply as a charging surface. Power can be wirelessly transferred to a receiving device located anywhere on the surface of the apparatus. The devices can have an arbitrarily defined size and/or shape and may be placed without regard to any discrete placement locations predesignated or pre-enabled for charging. Multiple devices can be simultaneously charged on a single surface. The apparatus can track motion of one or more devices across the surface.

Certain aspects disclosed herein relate to improved wireless charging techniques. In various aspects of the disclosure, a wireless charging device may employ a switched mode power supply and a Class-E Amplifier to amplify power transmitted through one or more transmission coils. A method for amplifying power in the charging device includes configuring a choke in an amplifier stage to receive a current from an input of the amplifier stage, configuring a resonant network coupled to an output of the choke to provide an output current to a load of the power amplifier, configuring a first switch to short the output of the choke to circuit ground when turned on, configuring a power switching stage to couple a power supply to the input of the amplifier stage, configuring a second switch in the power switching stage to couple the input of the amplifier stage to circuit ground when turned on, and controlling operation of the first switch and the second switch in accordance with a timing sequence that defines a cycle of the output current. Controlling the first switch may include configuring the first switch to be turned on during a first stage of the cycle, to be turned on during a second stage of the cycle that follows the first stage of the cycle and to be turned off during a third stage of the cycle that follows the second stage of the cycle. Controlling the second switch may include configuring the second switch to be turned off during the first stage of the cycle, to be turned on during the second stage of the cycle, and to be turned on during the third stage of the cycle.

Charging Cells

According to certain aspects disclosed herein, a charging device may be provided using charging cells that are deployed adjacent to a surface of the charging device. In one example, the charging cells are arranged or deployed in accordance with a honeycomb packaging configuration. A charging cell may be implemented using one or more coils that can each induce a magnetic field along an axis that is substantially orthogonal to the surface of the charging device and adjacent to the coil. In this description, a charging cell may refer to an element having one or more coils where each coil is configured to produce an electromagnetic field that is additive with respect to the fields produced by other coils in the charging cell and directed along or proximate to a common axis.

In some examples, a charging cell includes coils that are stacked along a common axis and/or that overlap such that they contribute to an induced magnetic field substantially orthogonal to the surface of the charging device. In some examples, a charging cell includes coils that are arranged within a defined portion of the charging surface and the coils contribute to an induced magnetic field that is substantially orthogonal to the portion of the charging surface corresponding to the charging cell. In some implementations, charging cells may be configurable by providing an activating current to coils that are included in a dynamically-defined charging cell. For example, a charging device may include multiple stacks of coils arranged or deployed across a surface of the charging device, and the charging device may detect the location of a device to be charged and may select some combination of stacks of coils to provide a charging cell adjacent to the device to be charged. In some instances, a charging cell may include, or be characterized as a single coil. However, it should be appreciated that a charging cell may include multiple stacked coils and/or multiple adjacent coils or stacks of coils.

FIG. 1 illustrates an example of a charging cell 100 that may be deployed or configured in or near a charging surface of a charging device. In this example, the charging cell 100 has a substantially hexagonal shape that encloses one or more coils 102 constructed using conductors, wires or circuit board traces that can receive a current sufficient to produce an electromagnetic field in a power transfer area 104. In some examples, one or more coils 102 may have a shape that is substantially polygonal, including the hexagonal charging cell 100 illustrated in FIG. 1. In some examples, coils 102 can have other shapes. The shape of the coils 102 may be determined at least in part by the capabilities or limitations of fabrication technology, or to optimize layout of the charging cells on a substrate 106 such as a printed circuit board substrate. Each coil 102 may be implemented using wires, printed circuit board traces and/or other connectors arranged in a spiral configuration. Each charging cell 100 may span two or more layers separated by an insulator or substrate 106 such that coils 102 in different layers are centered around a common axis 108.

Figure 2:
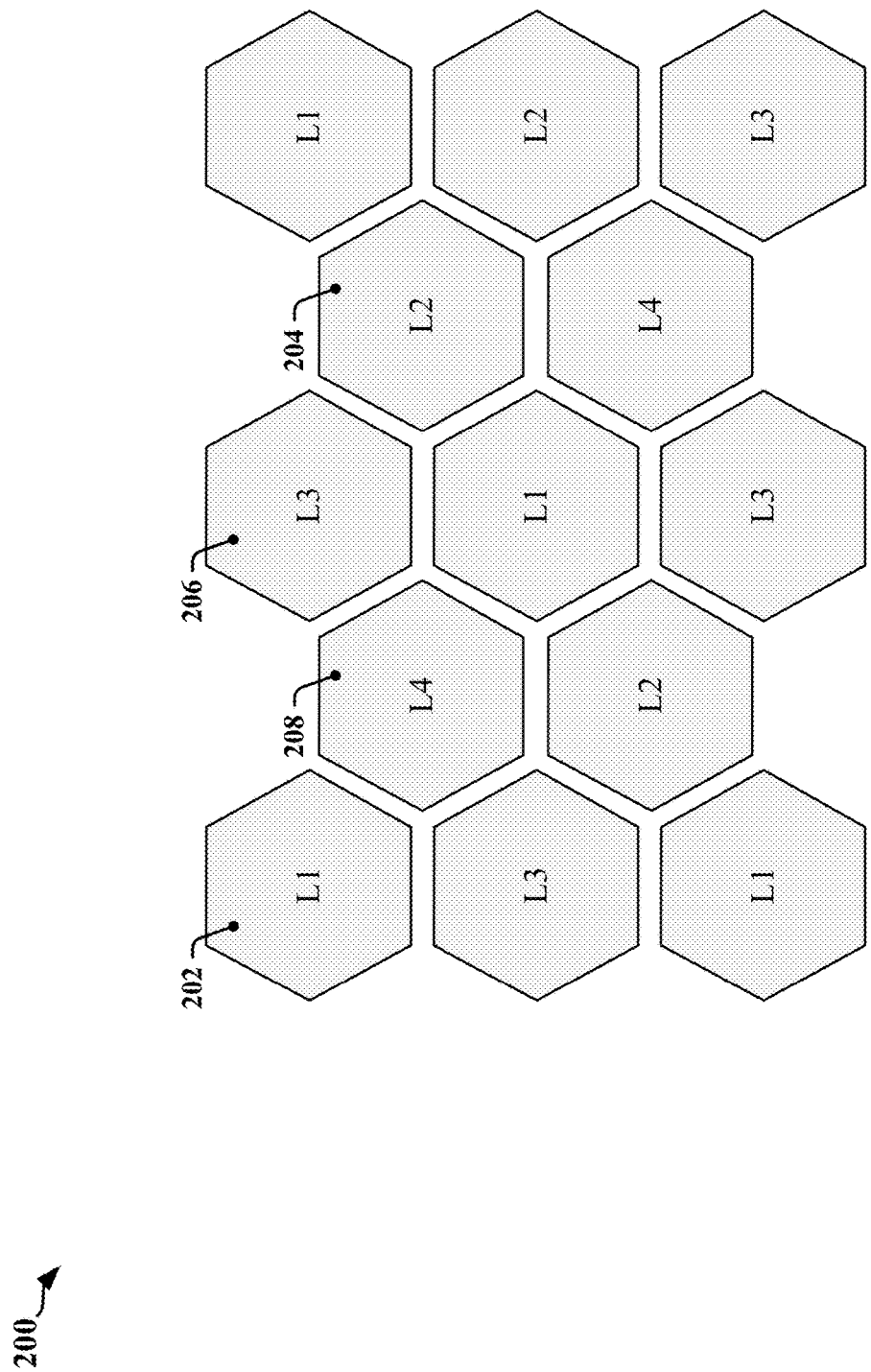
FIG. 2 illustrates the arrangement of power transfer areas provided on a charging surface of a wireless charging device configured in accordance with certain aspects disclosed herein.

FIG. 2 illustrates an example arrangement of power transfer areas provided across a charging surface 200 of a charging device. Here, the charging device employs multiple layers of charging cells to provide a charging surface 200 that may be configured or operated in accordance with certain aspects disclosed herein. The charging surface 200 may be constructed from four layers of charging cells 202, 204, 206, 208. In FIG. 2, each power transfer area provided by a charging cell in the first layer of charging cells 202 is marked "L1", each power transfer area provided by a charging cell in the second layer of charging cells 204 is marked "L2", each power transfer area provided by a charging cell in the third layer of charging cells 206 is marked "L3", and each power transfer area provided by a charging cell in the fourth layer of charging cells 208 is marked "L4".

Figure 3:
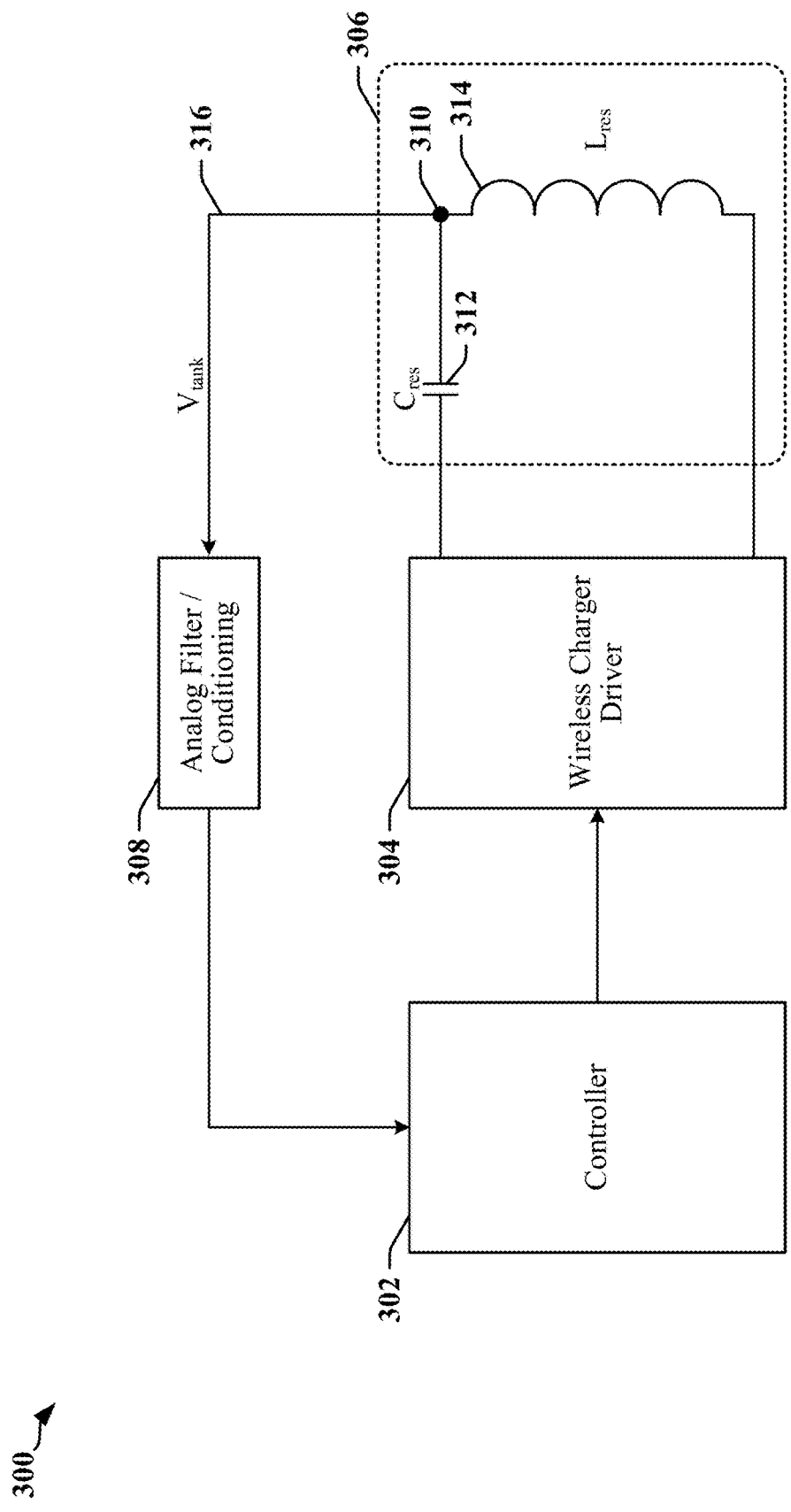
FIG. 3 illustrates a wireless transmitter that may be provided in a charger base station in accordance with certain aspects disclosed herein.

FIG. 3 illustrates a wireless transmitter 300 that may be provided in a charger base station. In some instances, a controller 302 may receive a feedback signal filtered or otherwise processed by a filter circuit 308. The controller 302 may control the operation of a driver circuit 304 that provides an alternating current (AC) signal to a resonant circuit 306 that includes a capacitor 312 and inductor 314. The resonant circuit 306 may also be referred to herein as a tank circuit, an LC tank circuit and/or as an LC tank, and the voltage 316 measured at an LC node 310 of the resonant circuit 306 may be referred to as the tank voltage.

The wireless transmitter 300 may be used by a charging device to determine if a compatible device has been placed on a surface of the charging device. For example, the charging device may determine that a compatible device has been placed on the surface of the charging device by sending an intermittent test signal (active ping) through the wireless transmitter 300, where the resonant circuit 306 may receive encoded signals when a compatible device responds to the test signal. The charging device may be configured to activate one or more coils in at least one charging cell after receiving a response signal defined by standard, convention, manufacturer or application. In some examples, the compatible device can respond to a ping by communicating measured or estimated received signal strength such that the charging device can find an optimal charging cell to be used for charging the compatible device.

Passive ping techniques may use the voltage or current measured or observed at the LC node 310 to identify the presence of a receiving coil in proximity to the charging pad of a device adapted in accordance with certain aspects disclosed herein. In many conventional wireless charger transmitters, circuits are provided to measure voltage at the LC node 310 or to measure the current in the network. These voltages and currents may be monitored for power regulation purposes or to support communication between devices. In the example illustrated in FIG. 3, voltage at the LC node 310 is monitored, although it is contemplated that current may additionally or alternatively be monitored to support passive ping. A response of the resonant circuit 306 to a passive ping (initial voltage V₀) may be represented by the voltage ($V_{LC}$) at the LC node 310, such that:

$$V_{LC} = V_0 e^{-\left(\frac{\omega}{2Q}\right)t} \quad \text{(Eq. 1)}$$

According to certain aspects disclosed herein, coils in one or more charging cells may be selectively activated to provide an optimal electromagnetic field for charging a compatible device. In some instances, coils may be assigned to charging cells, and some charging cells may overlap other charging cells. In the latter instances, the optimal charging configuration may be selected at the charging cell level. In other instances, charging cells may be defined based on placement of a device to be charged on a surface of the charging device. In these other instances, the combination of coils activated for each charging event can vary. In some implementations, a charging device may include a driver circuit that can select one or more cells and/or one or more predefined charging cells for activation during a charging event.

Power Amplification in a Charging Device

Figure 4:
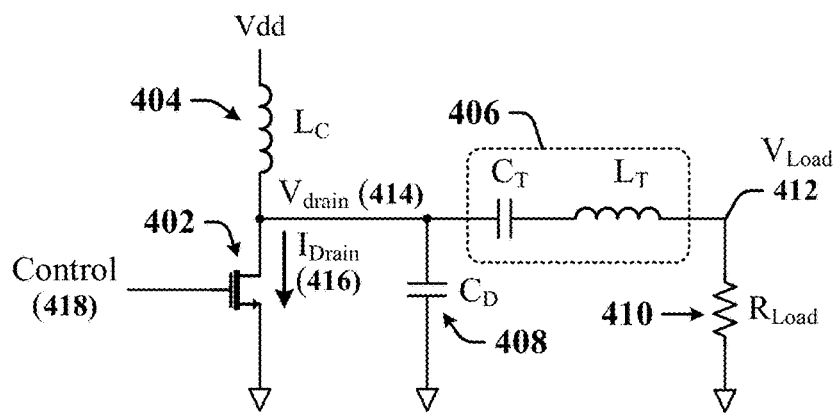
FIG. 4 illustrates an example of a Class-E amplifier.
Figure 4:
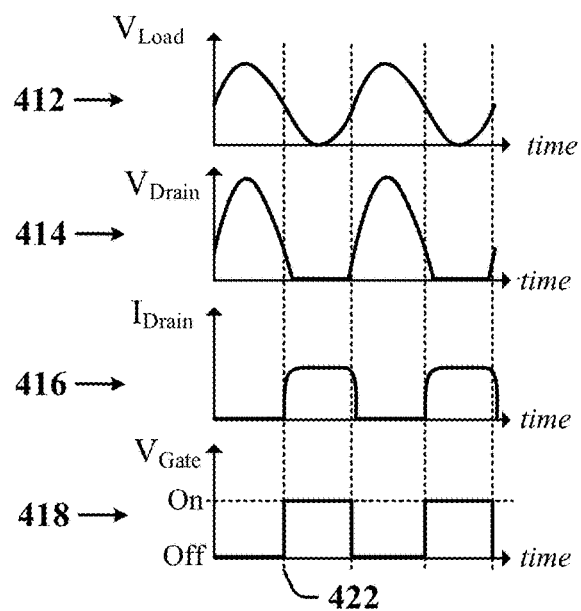

One aspect of this disclosure relates to the use of a Class-E amplifier in a driver circuit that provides a charging current to a transmitting coil in a wireless charging device. A Class-E amplifier can operate as a tuned switching power amplifier and may be characterized by high efficiency operation. FIG. 4 illustrates an example of a Class-E amplifier 400. A transistor switch is coupled to a load 410 through a resonant network 406. In one aspect, the transistor switch may be implemented using a metal-oxide-semiconductor field-effect transistor (MOSFET), such as the N-channel MOSFET (NFET 402) illustrated in FIG. 4. In the illustrated example, the drain of the NFET 402 is coupled to a direct current (DC) power source through a choke 404. The choke 404 may be implemented using an inductor and may be configured to block higher-frequency currents while passing DC and low-frequency alternating current (AC). The NFET 402 is switched at an operating frequency corresponding to the resonant frequency of the resonant network 406. The choke 404 may be selected based on its ability to block current cycling at the operating frequency. The NFET 402 provides a low-impedance path to ground for the input to the resonant network 406 when the NFET 402 is turned on. When the NFET 402 is turned off, the input to the resonant circuit receives a current flow from the DC power source through the choke 404.

The timing diagrams 420 illustrate operation of the Class-E amplifier 400 at the resonant frequency of the resonant network 406. The resonant frequency of the resonant network 406 may be affected or altered by the drain capacitance 408 of the NFET 402. A control signal 418 provided to the gate of the NFET 402 switches at a frequency corresponding to the resonant frequency of the resonant network 406. When the NFET 402 is switched on, a current 416 flows through the drain of the NFET 402. When the NFET 402 is switched off, a very low leakage current or no current 416 flows through the drain of the NFET 402. When the NFET 402 is switched off, the drain voltage 414 begins to rise at a rate determined by reactive components of the amplifier. The drain voltage 414 then falls from a peak voltage and the NFET 402 is switched on at a time 422 when the drain voltage 414 is approaching zero volts. The output voltage 412 oscillates with a fundamental frequency that corresponds to the resonant frequency of the resonant network 406. The Class-E amplifier 400 can achieve high operating efficiency by turning on the NFET 402 at points of zero current and turning off the NFET 402 at points zero voltage, thereby minimizing power lost in the switch.

Wireless charging devices are expected to charge a variety of chargeable devices, and each chargeable device may present a variable impedance to the wireless transmitter based on positioning and other factors. A wireless charging device may be required to adjust its output power level to accommodate the operating state of a chargeable device including, for example, the temperature state of a battery. Additional control loop and filter components are typically required to control output power levels of a charging device. Output control for a Class-E amplifier may be provided as a buck/boost circuit for front-end DC power control. A buck/boost circuit operates as a DC-to-DC converter that can provide an output voltage that has increased or decreased magnitude with respect to the input voltage. A buck/boost circuit operates as a buck converter when it decreases the input voltage to obtain the output voltage. A buck/boost circuit operates as a boost converter when it increases the input voltage to obtain the output voltage.

In many systems, DC power is provided to the wireless transmitter using a pre-regulator switched-mode power supply (SMPS). The SMPS and associated power control circuits typically operate at a frequency much higher than the resonant frequency of the Class-E amplifier. High frequency SMPS operation can decrease the efficiency of the wireless charging device and can introduce or increase unwanted harmonic content in the magnetic components. In addition, the SPMS may operate at a frequency that is between 4 and 10 times the fundamental frequency of the transmitted output of the power amplifier and the difference in operating frequencies between SMPS and amplifier necessitates the use of more complex and costly power control circuits.

Certain aspects of this disclosure provide a power supply topology and architecture that includes a switched-mode power supply and a Class-E amplifier configured to provide output power control with low harmonics on the output load. When incorporated in a wireless charging device, the power supply topology may be referred to as a Free Boost topology.

Figure 5:
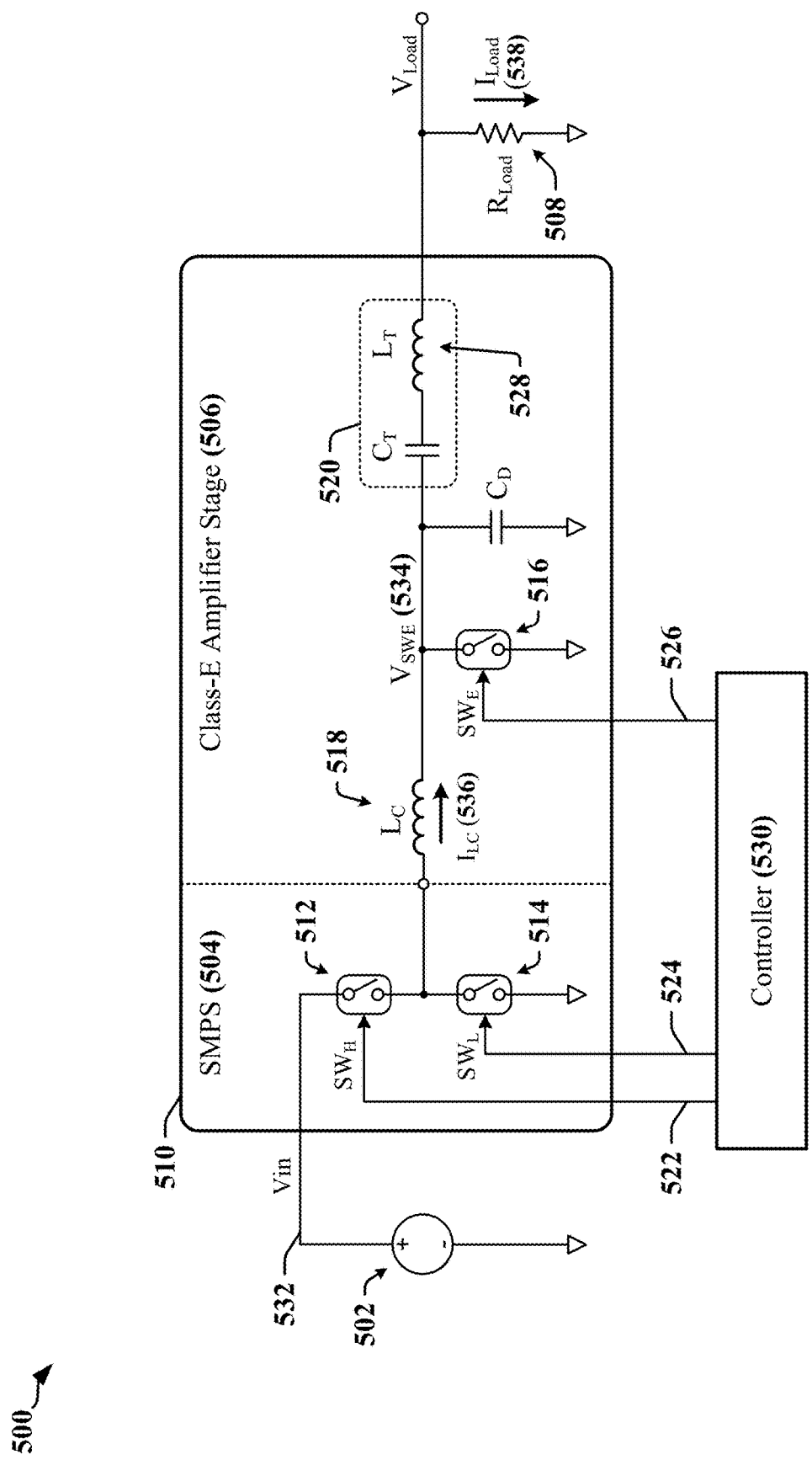
FIG. 5 illustrates a charging system that includes a power supply constructed or configured in accordance with certain aspects of the disclosure.

FIG. 5 illustrates a charging system 500 that includes a power supply 510 constructed or configured in accordance with certain aspects of the disclosure. The power supply 510 includes a switched-mode power supply (the SPMS 504) coupled to a power source 502 and a Class-E amplifier 506. The power supply 510 can synchronously control peak current in the choke, which is illustrated in FIG. 5 as $L_C$ 518. A controller 530 provides control signals 522 and 524 to the switches 512 and 514 in the SPMS 504, and provides a control signal 526 to the switch 516 in the Class-E amplifier 506. In one example, the switches 512, 514 and 516 are implemented using NFET transistors. The control signals 522, 524, 526 may be synchronized such that the SPMS 504 can operate at the same switching frequency as the Class-E amplifier 506. The duty cycle of one or more of the control signals 522, 524, 526 can be selected to control buck or boost operation in the power supply 510.

The configuration of the SPMS 504 and the Class-E amplifier 506 can preserve the high efficiency levels associated with the Class-E amplifier 506 and can eliminate or limit high-frequency harmonics in $L_C$ 518 and the inductor ($L_T$ 528) in the resonant output network 520. In one example, $L_T$ 528 includes a transmitting coil used to transmit power to a chargeable device, and the load 508 of the power supply 510 incorporates or corresponds to the reflected load presented by the chargeable device. The reduction of high-frequency harmonics can improve the efficacy of the charging system 500 and can limit electromagnetic interference. The power supply 510 can be implemented with a lower parts count than a comparable conventional, power-controlled power supply.

The controller 530 may be implemented using a state machine, sequencer or delay loops configured to produce a repeating sequence of pulses. The configuration of the SPMS 504 and the Class-E amplifier 506 provides for linear control of output power and for simple control of the SPMS 504 and the Class-E amplifier 506. In some instances, the controller 530 may be configured to control output power on a cycle-by-cycle basis.

Figure 6:
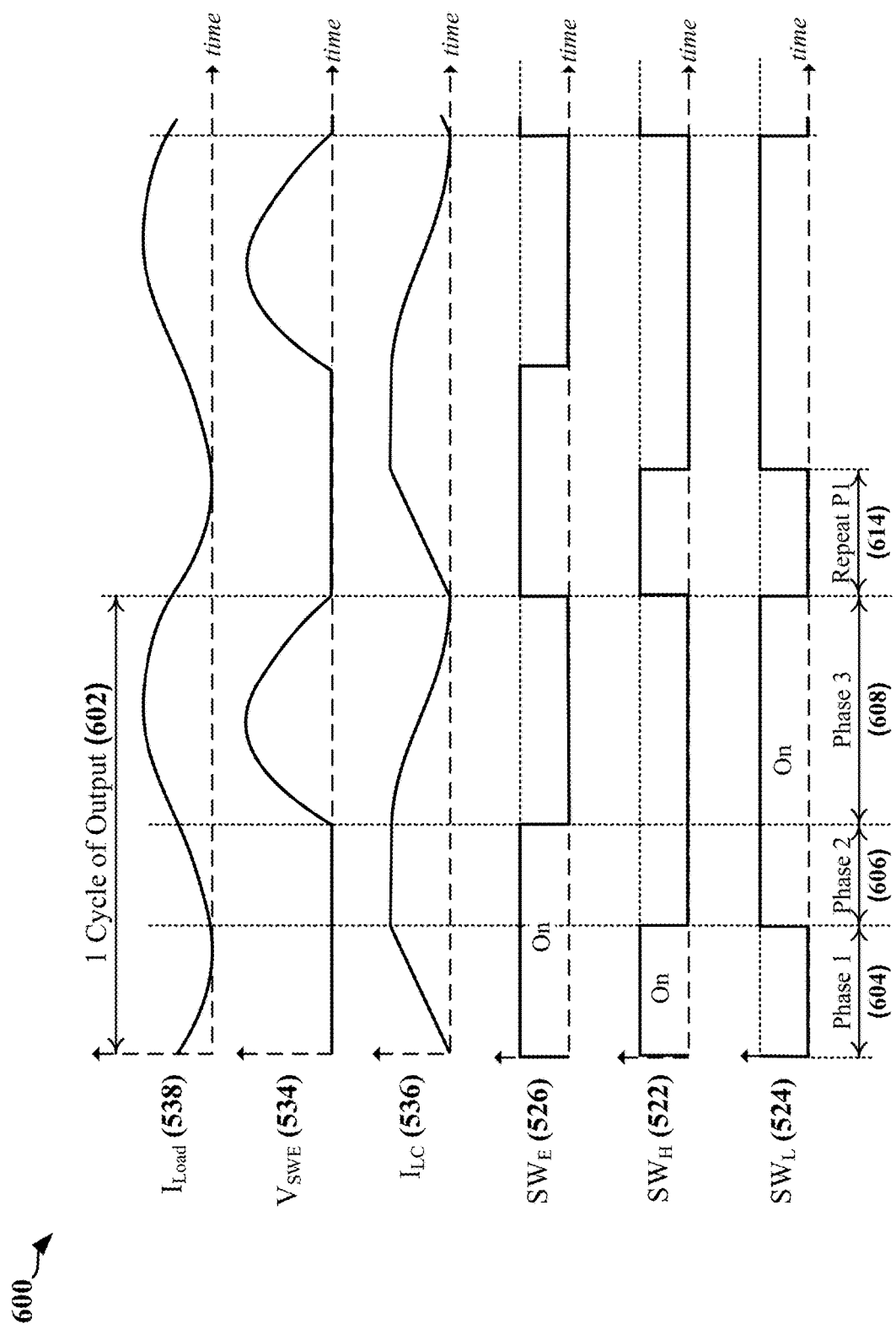
FIG. 6 is a timing diagram that illustrates one example of the operation of the power supply illustrated in FIG. 5.

FIG. 6 is a timing diagram 600 that illustrates a first mode of operation of the power supply 510 illustrated in FIG. 5. Three phases 604, 606, 608 may be defined within each cycle 602 of the output current 538. The three phases 604, 606, 608 correspond to three stages of power generation. In this first example, the cycle 602 includes a "freewheeling"

phase. In some instances, one or more of the stages of power generation may map to angular phases of the cycle 602 of the output current 538, but such correspondence is not expected or required. In some instances, the output current 538 represents power transfer to the load 508.

In the first phase 604, the power supply 510 builds current 536 in $L_C$ 518. The controller 530 configures the control signals 522, 524, 526 to turn on $SW_H$ 512 and $SW_E$ 516, and to turn off $SW_L$ 514 in the first phase 604. This configuration of switching causes the current 536 in $L_C$ 518 to increase at a rate proportional to the ratio of Vin 532 and $L_C$ 518. The rate of increase in the current 536 may be expressed as:

$$di = k\frac{Vin}{L_C}dt,$$

where k represents a scaling factor that may not equal 1 in some instances.

In the second phase 606, the controller 530 configures the control signals 522, 524, 526 to turn on $SW_L$ 514 and $SW_E$ 516 and turn off $SW_H$ 512. The current 536 in $L_C$ 518 begins to free-wheel through $SW_L$ 514 and $SW_E$ 516.

The third phase 608 may be referred to as the power delivery stage. The controller 530 configures the control signals 522, 524, 526 to turn on $SW_L$ 514, to turn off $SW_H$ 512 and to turn off $SW_E$ 516. The current 536 in $L_C$ 518 begins to decrease as it starts to flow into the resonant output network 520 that provides the output of the power supply 510. The voltage ($V_{SWE}$ 534) on the closed $SW_E$ 516 increases to a peak that is a multiple of Vin 532 and then transitions smoothly back to zero.

When $V_{SWE}$ 534 falls back to zero volts or crosses a threshold close to zero volts, the cycle 602 may be repeated commencing with a new first phase 614. A charging system 500 configured in accordance with certain aspects of this disclosure can provide a pure sinusoidal output current 538 flow through a load 508, and high frequency harmonics may be limited or absent in the core of $L_C$ 518 and/or the inductor ($L_T$ 528) in the resonant output network 520.

The switching frequency of the charging system 500 may be configured or defined based on output AC load requirements. The on-time of $SW_E$ 516 may be defined by the resonant output network 520 and may be tuned using any suitable Class-E tuning technique. The on time of $SW_H$ 512 and of $SW_L$ 514 may be configured based on the level of output power that is required by the load. In one example, the level of output power that is required by the load is determined from a charging configuration to be used for wirelessly charging a chargeable device. The charging configuration may be defined by protocol or negotiation between the chargeable device and the charging system 500. In one example, the charging system 500 may be provided in a multidevice or multi-coil charger and the charging configuration may identify the level of output power to be delivered to one or more transmitting coils. As the duty cycle of the control signals 522, 524 provided to operate $SW_H$ 512 and $SW_L$ 514 increase toward 100%, output power delivered to the load increases. In some instances, the control signal 522 provided to $SW_H$ 512 may be the inverse of the control signal 524 provided to $SW_L$ 514.

A lower duty cycle of the control signals 522, 524 that are provided to operate $SW_H$ 512 and $SW_L$ 514 limits the peak current in $L_C$ 518 when the power supply 510 is in the first phase 604. Having a lower peak current in $L_C$ 518 when transitioning into the third phase 608 may limit the total power that is transferred to the load. Duty cycle control can be used to provide output power control without modifying the Class-E switching times.

Figure 7:
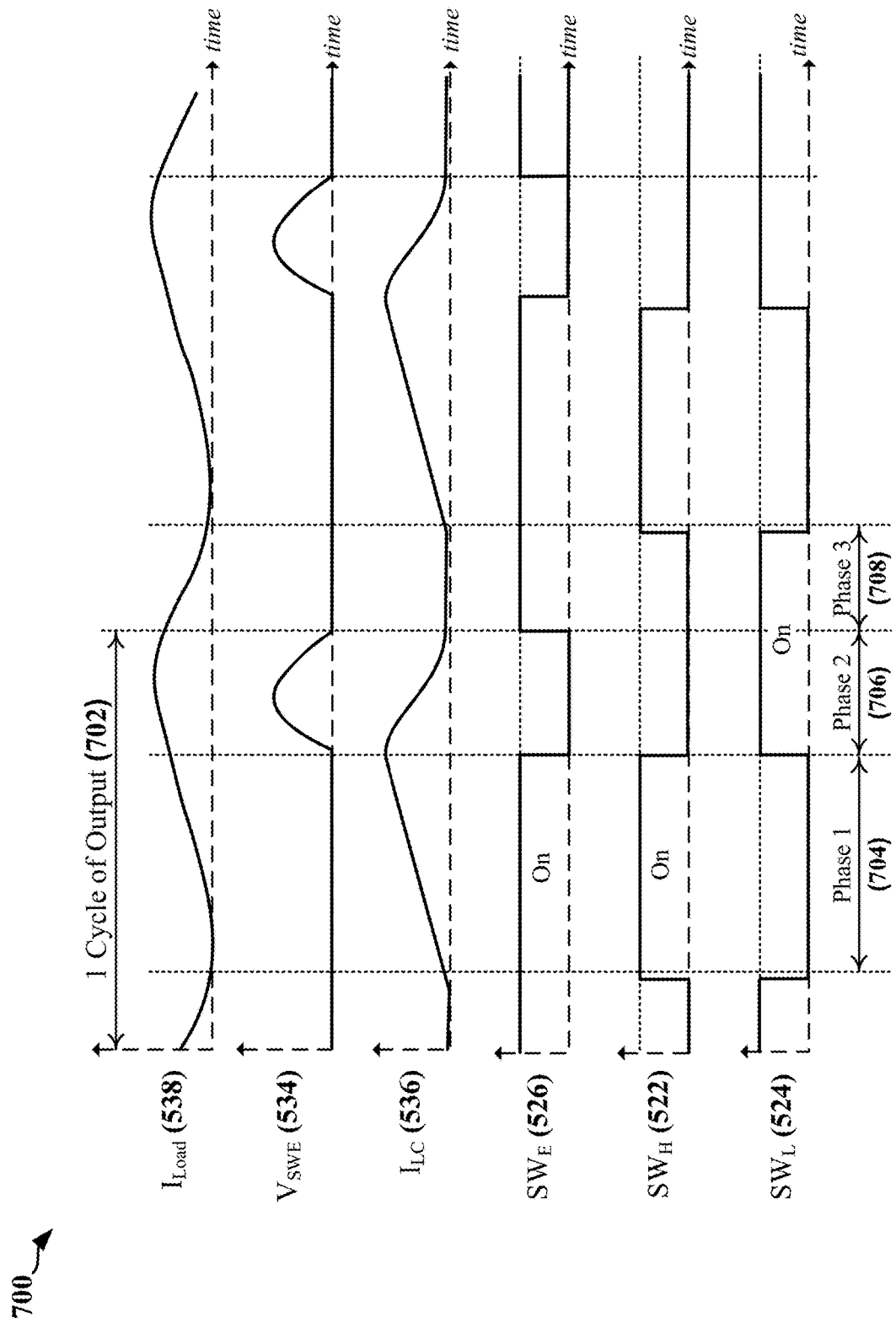
FIG. 7 is a timing diagram that illustrates a second mode of operation of the power supply illustrated in FIG. 5.

FIG. 7 is a timing diagram 700 that illustrates a second mode of operation of the power supply 510 illustrated in FIG. 5. Three phases 704, 706, 708 may be defined within each cycle 702 of the output current 538. The three phases 704, 706, 708 define three stages of power generation and do not include a "freewheeling" phase. In some instances, one or more of the stages or phases of power generation may map to angular phases of one cycle 702 of the output current 538, but such correspondence is not expected or required. In one example, the output current 538 represents power transfer to the load 508. In this operational mode, turn on of $SW_H$ 512 is delayed until a predefined or preconfigured time before the power delivery stage. The delay duration can be used to control the output power. A longer delay results in less current built up in $L_C$ 518.

In the first phase 704, the power supply 510 builds current 536 in $L_C$ 518. The controller 530 configures the control signals 522, 524, 526 to turn on $SW_H$ 512 and $SW_E$ 516, and to turn off $SW_L$ 514. This configuration of switching causes the current 536 in $L_C$ 518 to increase at a rate proportional to the ratio of Vin 532 and $L_C$ 518.

The second phase 706 may be referred to as the power delivery stage. The controller 530 configures the control signals 522, 524, 526 to turn on $SW_L$ 514, to turn off $SW_H$ 512 and to turn off $SW_E$ 516. The current 536 in $L_C$ 518 begins to decrease as it starts to flow into the resonant output network 520 that provides the output of the power supply 510. The voltage ($V_{SWE}$ 534) on the closed $SW_E$ 516 increases to a peak that is a multiple of Vin 532 and then transitions smoothly back to zero.

In the third phase 708, which may be referred to as the delay stage, the controller 530 configures the control signals 522, 524, 526 to turn on $SW_L$ 514 and $SW_E$ 516 and turn off $SW_H$ 512. The configuration of switches is maintained for the delay duration.

The switching frequency of the charging system 500 may be configured or defined based on output AC load requirements. The on-time of $SW_E$ 516 may be defined by the resonant output network 520 and may be tuned using any suitable Class-E tuning technique. The duration of the delay in the third phase 708 and/or the on time of $SW_H$ 512 may be configured based on the level of output power that is required to be delivered to the load 508. In one example, the level of output power that is required to be delivered to the load 508 is determined from a charging configuration to be used for wirelessly charging a chargeable device. The charging configuration may be defined by protocol or negotiation between the chargeable device and the charging system 500. In one example, the charging system 500 may be provided in a multidevice charger and the charging configuration may identify the level of output power to be delivered to one or more transmitting coils. As the duty cycle of the control signals 522, 524 provided to operate $SW_H$ 512 and $SW_L$ 514 increase toward 100%, output power delivered to the load 508 increases. In some instances, the control signal 522 provided to $SW_H$ 512 may be the inverse of the control signal 524 provided to $SW_L$ 514.

A lower duty cycle of the control signals 522, 524 that are provided to operate $SW_H$ 512 and $SW_L$ 514 limits the peak current in $L_C$ 518 when the power supply 510 is in the first phase 704. Having a lower peak current in $L_C$ 518 when transitioning to into the third phase 708 may limit the total power that is transferred to the load 508. Duty cycle control can be used to provide output power control without modifying the Class-E switching times.

A charging system 500 configured without a freewheeling phase in accordance with certain aspects of this disclosure can reduce or eliminate losses attributable to the equivalent series resistance (ESR) of $L_C$ 518. ESR represents the series resistance of a non-ideal capacitor or inductor and may be measured or defined for the expected operating frequency of the circuit that includes the capacitor or inductor. The elimination of the freewheeling phase renders $SW_L$ 514 optional if operating in discontinuous mode and, if operating in continuous mode, $SW_L$ 514 may be replaced by a diode in some instances.

Figure 8:
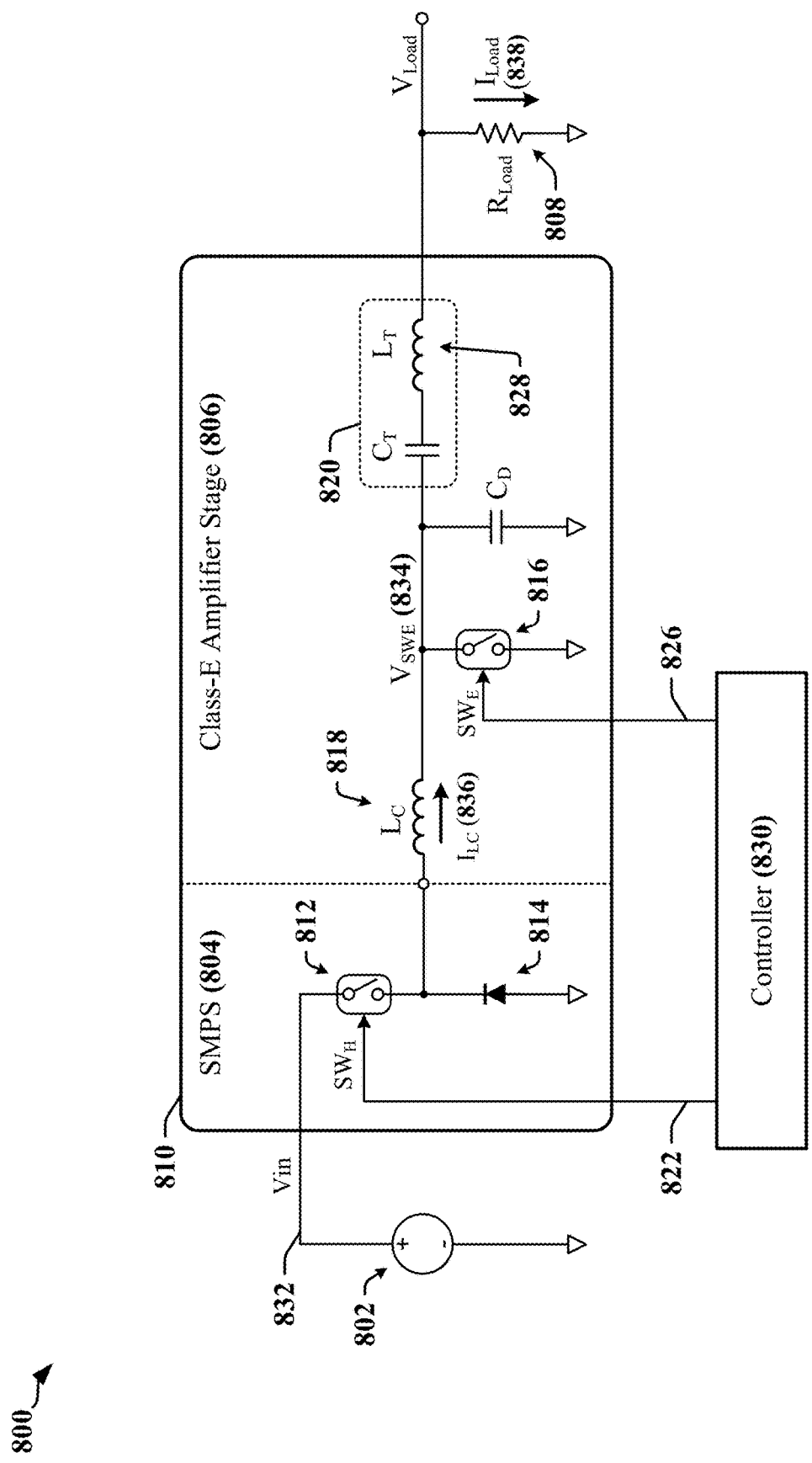
FIG. 8 illustrates a charging system that includes a power supply constructed or configured for operation without a freewheeling phase in accordance with certain aspects of the disclosure.

FIG. 8 illustrates a charging system 800 that includes a power supply 810 constructed or configured for operation without a freewheeling phase in accordance with certain aspects of the disclosure. The power supply 810 includes a switched-mode power supply (the SPMS 804) coupled to a power source 802 and a Class-E amplifier 806. The power supply 810 can synchronously control peak current in the choke, which is illustrated in FIG. 8 as $L_C$ 818. A controller 830 provides a control signal 822 to the switch 812 in the SPMS 804 and provides a control signal 826 the switch 816 in the Class-E amplifier 806. The control signals 822 and 826 may be synchronized such that the SPMS 804 can operate at the same switching frequency as the Class-E amplifier 806. A diode 814 substitutes for the second switch in the power supply 510 illustrated in FIG. 5 (i.e., $SW_L$ 514).

The configuration of the SPMS 804 and the Class-E amplifier 806 can preserve the high efficiency levels associated with the Class-E amplifier 806 and can eliminate or limit high-frequency harmonics in $L_C$ 818 and the inductor ($L_T$ 828) in the resonant output network 820. In one example, $L_T$ 828 includes a transmitting coil used to transmit power to a chargeable device. The load 808 of the power supply 810 corresponds or incorporates the reflected load presented by the chargeable device. The reduction of high-frequency harmonics can improve the efficacy of the charging system 800 and can limit electromagnetic interference. The power supply 810 can be implemented with a lower parts count than a comparable conventional, power-controlled power supply.

The controller 830 may be implemented using a state machine, sequencer or delay loops configured to produce a repeating sequence of pulses. The configuration of the SPMS 804 and the Class-E amplifier 806 provides for linear control of output power and for simple control of the SPMS 804 and the Class-E amplifier 806. In some instances, the controller 830 may be configured to control output power on a cycle-by-cycle basis.

Figure 9:
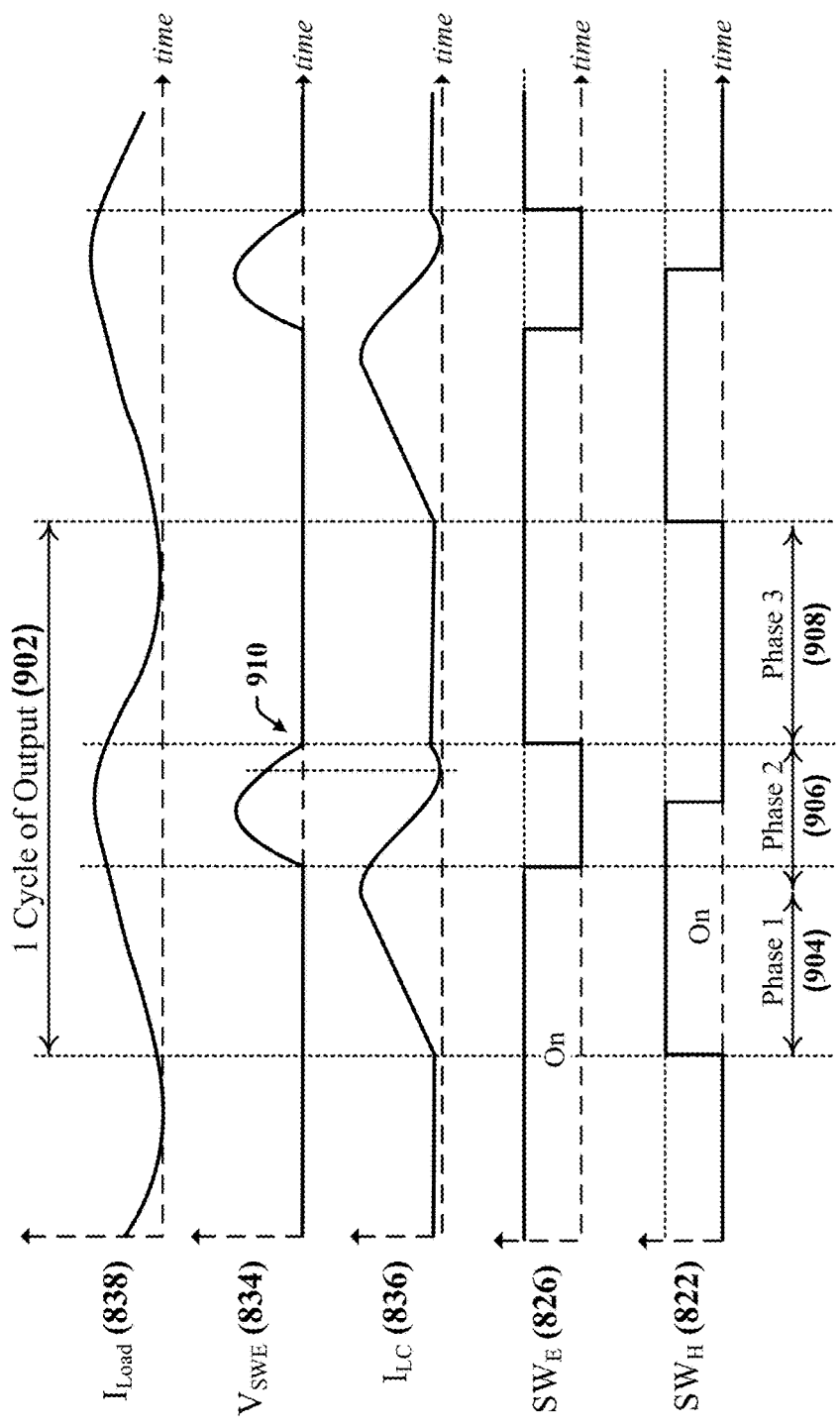
FIG. 9 is a timing diagram that illustrates operation the power supply illustrated in FIG. 8.

FIG. 9 is a timing diagram 900 that illustrates operation the power supply 810 illustrated in FIG. 8. Three phases 904, 906, 908 may be defined within each cycle 902 of the output current 838. The three phases 904, 906, 908 define three stages of power generation, without a "freewheeling" phase. In some instances, one or more of the stages of power generation may map to angular phases of the cycle 902 of the output current 838, but such correspondence is not expected or required. In one example, the output current 838 represents power transfer to the load 808. In this operational mode, turn on of $SW_H$ 812 is delayed until a predefined or preconfigured time before the power delivery stage. The delay duration can be used to control the output power. A longer delay results in less current built up in $L_C$ 818.

In the first phase 904, the power supply 810 builds current 836 in $L_C$ 818. The controller 830 configures the control signals 822, 826 to turn on $SW_H$ 812 and $SW_E$ 816. This configuration of switching causes the current 836 in $L_C$ 818 to increase at a rate proportional to the ratio of Vin 832 and $L_C$ 818.

The second phase 906 may be referred to as the power delivery stage. The controller 830 configures the control signals 822, 826 to turn off $SW_H$ 812 and to turn off $SW_E$ 816. $SW_H$ 812 may be turned off at a different point in the phase 906 than $SW_E$ 816. The current 836 in $L_C$ 818 begins to decrease as it starts to flow into the resonant output network 820 that provides the output. The voltage $V_{SWE}$ 834 on the closed $SW_E$ 816 increases to a peak that is a multiple of Vin 832 and then transitions smoothly back to zero 910.

In the third phase 908, which may be referred to as the delay phase, the controller 830 configures the control signals 822 and 826 to turn on $SW_E$ 816 and turn off $SW_H$ 812. The configuration of switches is maintained for the delay duration.

The switching frequency of the charging system 800 may be configured or defined based on output AC load requirements. The on-time of $SW_E$ 816 may be defined by the resonant output network 820 and may be tuned using any suitable Class-E tuning technique. The duration of the delay in the third phase 908 and/or the on time of $SW_H$ 812 may be configured based on the level of output power that is required to be delivered to the load 808. In one example, the level of output power that is to be delivered to the load 808 is determined from a charging configuration to be used for wirelessly charging a chargeable device. The charging configuration may be defined by protocol or negotiation between the chargeable device and the charging system 800. In one example, the charging system 800 may be provided in a multidevice charger and the charging configuration may identify the level of output power to be delivered to one or more transmitting coils. As the duty cycle of the control signal 822 provided to operate $SW_H$ 812 increases toward 100%, output power delivered to the load 808 increases. Duty cycle control of the control signal 822 provided to operate $SW_H$ 812 can be used to provide output power control without modifying the Class-E switching times.

Figure 10:
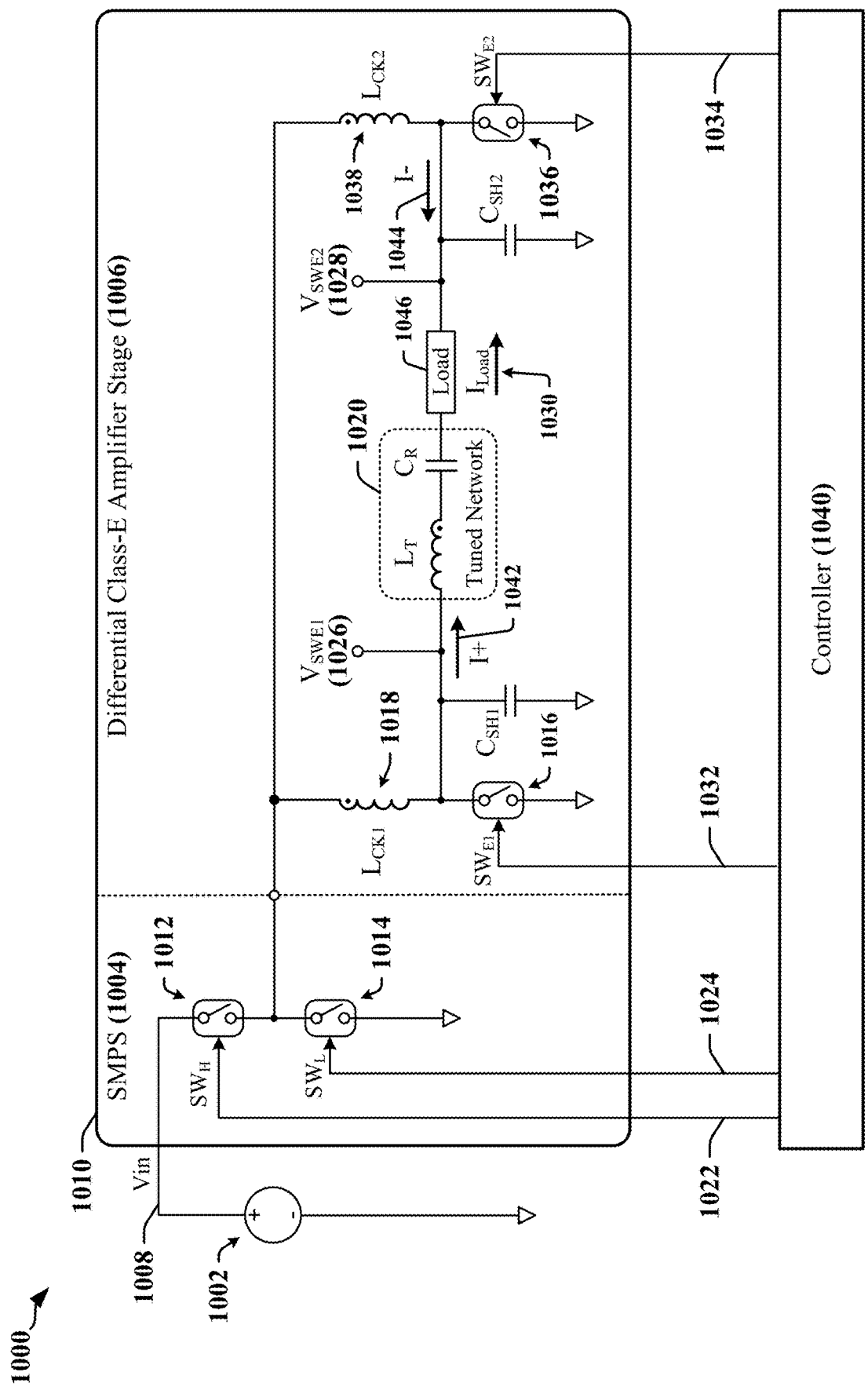
FIG. 10 illustrates a charging system that includes a power supply configured with a switched-mode power supply and a Differential Class-E amplifier in accordance with certain aspects of the disclosure.
Figure 11:
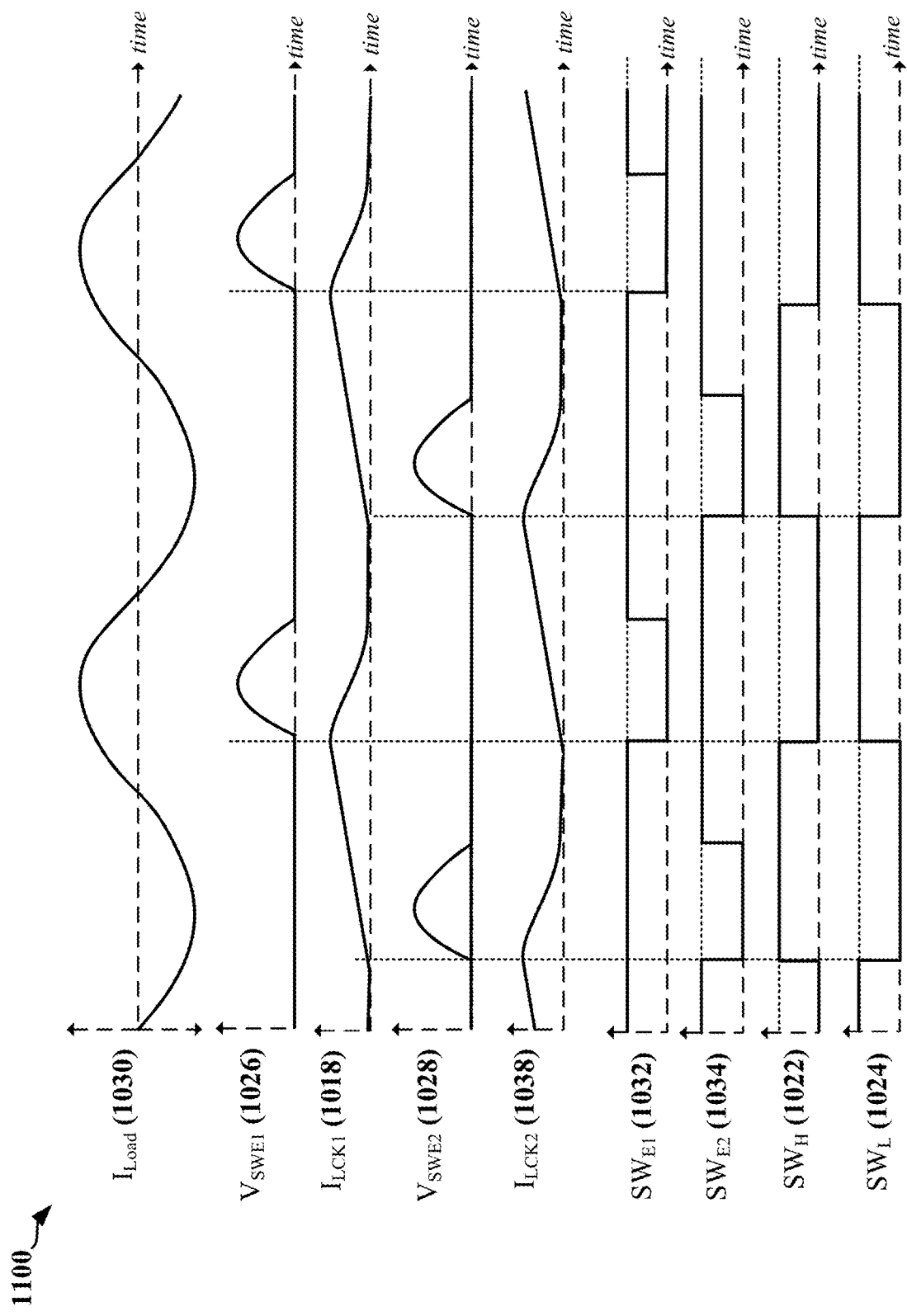
FIG. 11 is a timing diagram that illustrates operation the power supply illustrated in FIG. 10.

Certain aspects of this disclosure are applicable to charging systems, including wireless charging systems and to different configurations of SPMS or amplifiers in the power supply. For example, a differential Class-E amplifier may be used in some applications. FIG. 10 illustrates a charging system 1000 that includes a power supply 1010 configured with a switched-mode power supply (the SPMS 1004) coupled to a power source 1002 and a Differential Class-E amplifier 1006 in accordance with certain aspects of the disclosure. FIG. 11 is a timing diagram 1100 that illustrates operation the power supply 1010 illustrated in FIG. 10. The Differential Class-E amplifier 1006 includes two sections, each delivering a half-cycle 1042, 1044 of the current $I_{Load}$ 1030 output by the power supply 1010. Each section operates as a Class-E amplifier and includes a choke ($L_{CK1}$ 1018 and $L_{CK2}$ 1038), and a switch ($SW_{E1}$ 1016, $SW_{E2}$ 1036). Peak current may be synchronously controlled in $L_{CK1}$ 1018 and $L_{CK2}$ 1038. A controller 1040 provides control signals 1022 and 1024 to the switches ($SW_H$ 1012 and $SW_L$ 1014) in the SPMS 1004. The controller 1040 provides control signal 1032 to $SW_{E1}$ 1016 and control signal 1034 to $SW_{E2}$ 1036 in the Differential Class-E amplifier 1006. In the illustrated example, there is a phase shift of 180° between the control signal 1032 provided to $SW_{E1}$ 1016 and the control signal 1034 provided to $SW_{E2}$ 1036. In other examples, the control signal 1032 provided to $SW_{E1}$ 1016 may be more or less than 180° out of phase with the control signal 1034 provided to $SW_{E2}$ 1036.

The control signals 1022, 1024, 1032 and 1034 may be synchronized such that the SPMS 1004 can operate at the same switching frequency as the Differential Class-E amplifier 1006. Power control may be obtained through control of a duty cycle or through a duration of a delay phase of the power cycle.

The configuration of the SPMS 1004 and the Differential Class-E amplifier 1006 can preserve the high efficiency levels associated with the Differential Class-E amplifier 1006 and can eliminate or limit high-frequency harmonics in $L_{CK1}$ 1018 and $L_{CK2}$ 1038 and the inductor ($L_T$) in the resonant output network 1020. In one example, $L_T$ includes a transmitting coil used to transmit power to a chargeable device, and the load 1046 of the power supply 1010 corresponds or incorporates the reflected load presented by the chargeable device. The reduction of high-frequency harmonics can improve the efficacy of the charging system 1000 and can limit electromagnetic interference.

The controller 1040 may be implemented using a state machine, sequencer or delay loops configured to produce a repeating sequence of pulses. The configuration of the SPMS 1004 and the Differential Class-E amplifier 1006 provides for linear control of output power and for simple control of the SPMS 1004 and the Differential Class-E amplifier 1006. In some instances, the controller 1040 may be configured to control output power on a cycle-by-cycle basis.

Example of a Processing Circuit

Figure 12:
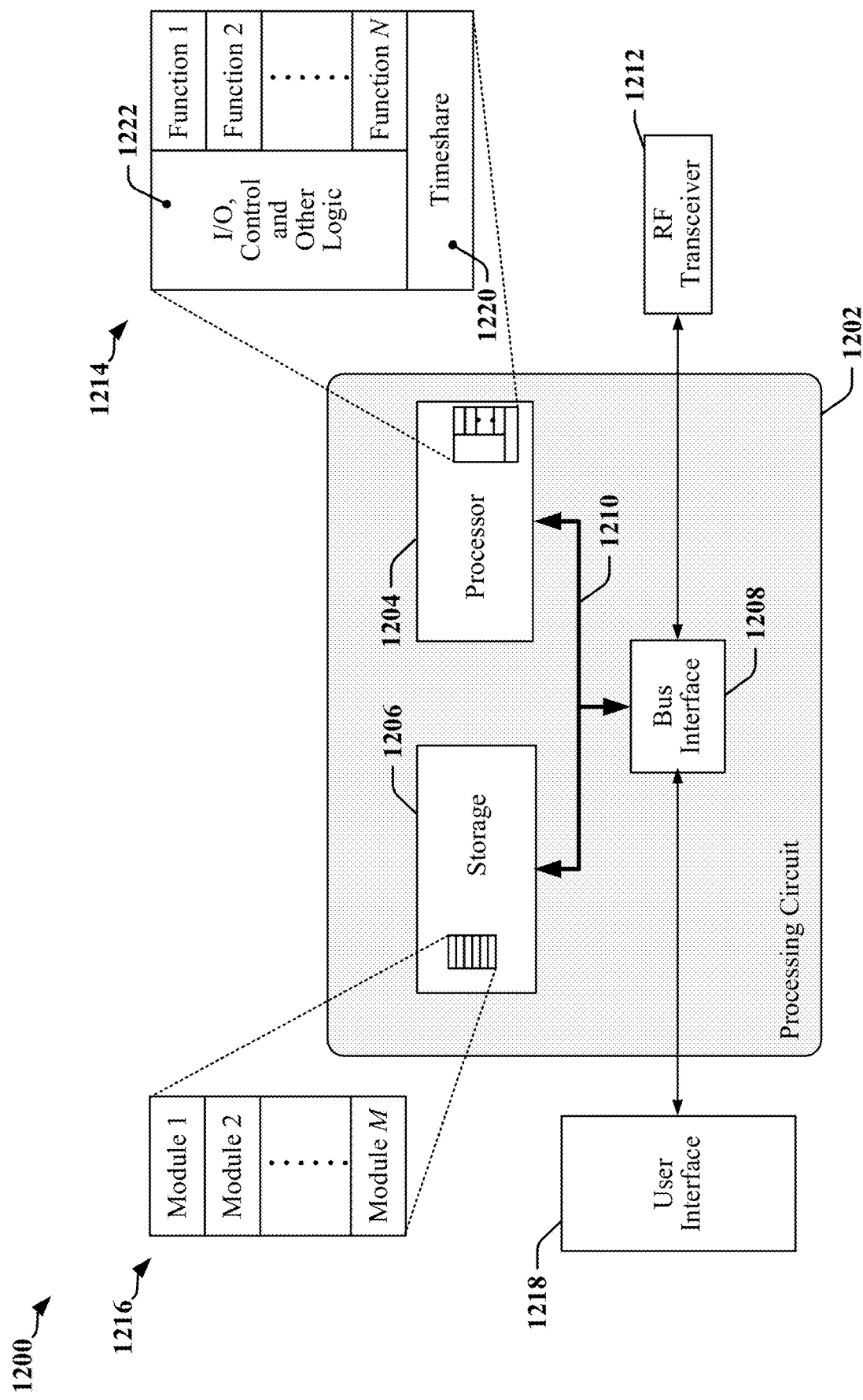
FIG. 12 illustrates one example of an apparatus employing a processing circuit that may be adapted according to certain aspects disclosed herein.

FIG. 12 illustrates an example of a hardware implementation for an apparatus 1200 that may be incorporated in a charging device or in a receiving device that enables a battery to be wirelessly charged. In some examples, the apparatus 1200 may perform one or more functions disclosed herein. In accordance with various aspects of the disclosure, an element, or any portion of an element, or any combination of elements as disclosed herein may be implemented using a processing circuit 1202. The processing circuit 1202 may include one or more processors 1204 that are controlled by some combination of hardware and software modules. Examples of processors 1204 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 1204 may include specialized processors that perform specific functions, and that may be configured, augmented or controlled by one of the software modules 1216. The one or more processors 1204 may be configured through a combination of software modules 1216 loaded during initialization, and further configured by loading or unloading one or more software modules 1216 during operation.

In the illustrated example, the processing circuit 1202 may be implemented with a bus architecture, represented generally by the bus 1210. The bus 1210 may include any number of interconnecting buses and bridges depending on the specific application of the processing circuit 1202 and the overall design constraints. The bus 1210 links together various circuits including the one or more processors 1204, and storage 1206. Storage 1206 may include memory devices and mass storage devices and may be referred to herein as computer-readable media and/or processor-readable media. The storage 1206 may include transitory storage media and/or non-transitory storage media.

The bus 1210 may also link various other circuits such as timing sources, timers, peripherals, voltage regulators, and power management circuits. A bus interface 1208 may provide an interface between the bus 1210 and one or more transceivers 1212. In one example, a transceiver 1212 may be provided to enable the apparatus 1200 to communicate with a charging or receiving device in accordance with a standards-defined protocol. Depending upon the nature of the apparatus 1200, a user interface 1218 (e.g., keypad, display, speaker, microphone, joystick) may also be provided, and may be communicatively coupled to the bus 1210 directly or through the bus interface 1208.

A processor 1204 may be responsible for managing the bus 1210 and for general processing that may include the execution of software stored in a computer-readable medium that may include the storage 1206. In this respect, the processing circuit 1202, including the processor 1204, may be used to implement any of the methods, functions and techniques disclosed herein. The storage 1206 may be used for storing data that is manipulated by the processor 1204 when executing software, and the software may be configured to implement any one of the methods disclosed herein.

One or more processors 1204 in the processing circuit 1202 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1206 or in an external computer-readable medium. The external computer-readable medium and/or storage 1206 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 1206 may also include, by way of example, a carrier wave, a transmission line, and any other suitable medium for transmitting software and/or instructions that may be accessed and read by a computer. Computer-readable medium and/or the storage 1206 may reside in the processing circuit 1202, in the processor 1204, external to the processing circuit 1202, or be distributed across multiple entities including the processing circuit 1202. The computer-readable medium and/or storage 1206 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1206 may maintain and/or organize software in loadable code segments, modules, applications, programs, etc., which may be referred to herein as software modules 1216. Each of the software modules 1216 may include instructions and data that, when installed or loaded on the processing circuit 1202 and executed by the one or more processors 1204, contribute to a run-time image 1214 that controls the operation of the one or more processors 1204. When executed, certain instructions may cause the processing circuit 1202 to perform functions in accordance with certain methods, algorithms and processes described herein.

Some of the software modules 1216 may be loaded during initialization of the processing circuit 1202, and these software modules 1216 may configure the processing circuit 1202 to enable performance of the various functions disclosed herein. For example, some software modules 1216 may configure internal devices and/or logic circuits 1222 of the processor 1204 and may manage access to external devices such as a transceiver 1212, the bus interface 1208, the user interface 1218, timers, mathematical coprocessors, and so on. The software modules 1216 may include a control program and/or an operating system that interacts with interrupt handlers and device drivers, and that controls access to various resources provided by the processing circuit 1202. The resources may include memory, processing time, access to a transceiver 1212, the user interface 1218, and so on.

One or more processors 1204 of the processing circuit 1202 may be multifunctional, whereby some of the software modules 1216 are loaded and configured to perform different functions or different instances of the same function. The one or more processors 1204 may additionally be adapted to manage background tasks initiated in response to inputs from the user interface 1218, the transceiver 1212, and device drivers, for example. To support the performance of multiple functions, the one or more processors 1204 may be configured to provide a multitasking environment, whereby each of a plurality of functions is implemented as a set of tasks serviced by the one or more processors 1204 as needed or desired. In one example, the multitasking environment may be implemented using a timesharing program 1220 that passes control of a processor 1204 between different tasks, whereby each task returns control of the one or more processors 1204 to the timesharing program 1220 upon completion of any outstanding operations and/or in response to an input such as an interrupt. When a task has control of the one or more processors 1204, the processing circuit is effectively specialized for the purposes addressed by the function associated with the controlling task. The timesharing program 1220 may include an operating system, a main loop that transfers control on a round-robin basis, a function that allocates control of the one or more processors 1204 in accordance with a prioritization of the functions, and/or an interrupt driven main loop that responds to external events by providing control of the one or more processors 1204 to a handling function.

In one implementation, the apparatus 1200 includes or operates as a wireless charging apparatus that has a battery charging power source coupled to a charging circuit, a plurality of charging cells and a controller, which may be included in the one or more processors 1204. The plurality of charging cells may be configured to provide a charging surface. Each charging cell may include at least one transmitting coil that is configured to direct an electromagnetic field through a charge transfer area of the charging cell. The apparatus 1200 may have a power amplifier that has an amplifier stage, a power switching stage and a controller.

The power amplifier may be configured to operate as a Class-E amplifier. The amplifier stage may include a choke configured to receive a current from an input of the amplifier stage, a resonant network coupled to an output of the choke and configured to provide an output current to a load of the power amplifier, and a first switch configured to short the output of the choke to circuit ground when turned on.

The power switching stage may be configured to couple a power supply to the input of the amplifier stage and may have a second switch operable to couple the input of the amplifier stage to circuit ground when turned on. The controller may be configured to control operation of the first switch and the second switch in accordance with a timing sequence that defines a cycle of the output current. In one example, the first switch is turned on during a first stage of the cycle, turned on during a second stage of the cycle that follows the first stage of the cycle and turned off during a third stage of the cycle that follows the second stage of the cycle, while the second switch is turned off during the first stage of the cycle, turned on during the second stage of the cycle, and turned on during the third stage of the cycle.

In one aspect, a duration of the timing sequence corresponds to a period of the cycle of the output current. In one aspect, the power switching stage includes a diode coupled to the output of the power supply and the input of the amplifier stage. The diode may be provided in place of the second switch. In another aspect, the power switching stage includes a third switch that provides the coupling between the power supply and the input of the amplifier stage when turned on. The controller may be further configured to control operation of the third switch. The third switch may be turned on during the first stage of the cycle and turned off during the second stage of the cycle and during the third stage of the cycle. The third switch may be turned on when the second switch is turned off. The controller may be further configured to control power level provided to an output of the power amplifier. Power level may be controlled using a variable duty cycle of control signals provided to control operation of the second switch and the third switch.

In one example, an output of the power amplifier is coupled to a transmitting coil of a wireless charging device. In the latter and in other examples, the load of the power amplifier may include one or more transmitting coils of a multi-device wireless charging device.

In some examples, the power amplifier has a second amplifier stage and the power amplifier may be configured to operate as a Differential Class-E amplifier. The second amplifier stage may have a second choke configured to receive a current from an input of the amplifier stage. A switch in the second amplifier stage may be configured to short the output of the second choke to circuit ground when turned on. The controller may be configured to control operation of the fourth switch in accordance with the timing sequence that defines a cycle of the output current. The controller may be configured to provide a control signal to the fourth switch that is 180° out of phase with a control signal provided to the first switch.

In some implementations, the storage 1206 maintains instructions and information where the instructions are configured to cause the one or more processors 1204 to cause a choke in an amplifier stage to receive a current from an input of the amplifier stage, cause a resonant network coupled to an output of the choke to provide an output current to a load of the power amplifier, configure a first switch to short the output of the choke to circuit ground when turned on, configure a power switching stage to couple a power supply to the input of the amplifier stage, configure a second switch in the power switching stage to couple the input of the amplifier stage to circuit ground when turned on, and control operation of the first switch and the second switch in accordance with a timing sequence that defines a cycle of the output current. Controlling the operation of the first switch may include configuring the first switch to be turned on during a first stage of the cycle, turned on during a second stage of the cycle that follows the first stage of the cycle and turned off during a third stage of the cycle that follows the second stage of the cycle. Controlling the operation of the second switch may include configuring the second switch to be turned off during the first stage of the cycle, turned on during the second stage of the cycle, and turned on during the third stage of the cycle.

In some examples, a duration of the timing sequence corresponds to a period of the cycle of the output current. The instructions may be configured to cause the one or more processors 1204 to configure a diode in the power switching stage to provide the coupling between the power supply and the input of the amplifier stage. The instructions may be configured to cause the one or more processors 1204 to configure a third switch in the power switching stage to provide the coupling between the power supply and the input of the amplifier stage, and control operation of the third switch in accordance with the timing sequence. The instructions may be configured to cause the one or more processors 1204 to configure the third switch to be turned on during the first stage of the cycle, turned off during the second stage of the cycle, and turned off during the third stage of the cycle. The instructions may be configured to cause the one or more processors 1204 to configure the third switch to be turned on when the second switch is turned off. The instructions may be configured to cause the one or more processors 1204 to configure the charging device to control power level provided to an output of the power amplifier. The power level is controlled by duty cycle of control signals provided to control operation of the second switch and the third switch.

In one example, the instructions cause the one or more processors 1204 to configure a second choke provided in a second amplifier stage to receive a current from an input of the amplifier stage, configure a fourth switch to short the output of the second choke to circuit ground when turned on, configure the power switching stage to couple a power supply to the input of the second amplifier stage, and control operation of the fourth switch in accordance with the timing sequence that defines the cycle of the output current. The operation of the fourth switch may be controlled by providing a first signal to a gate of the first switch and providing a second signal to a gate of the fourth switch. In one example, the second signal is 180° out of phase with the first signal. In other examples, the phase difference between the first signal and the second signal may be more or less than 180°.

In one example, an output of the power amplifier is coupled to a transmitting coil of a wireless charging device. In the latter and in other examples, the load of the power amplifier may include one or more transmitting coils of a multi-device wireless charging device.

Figure 13:
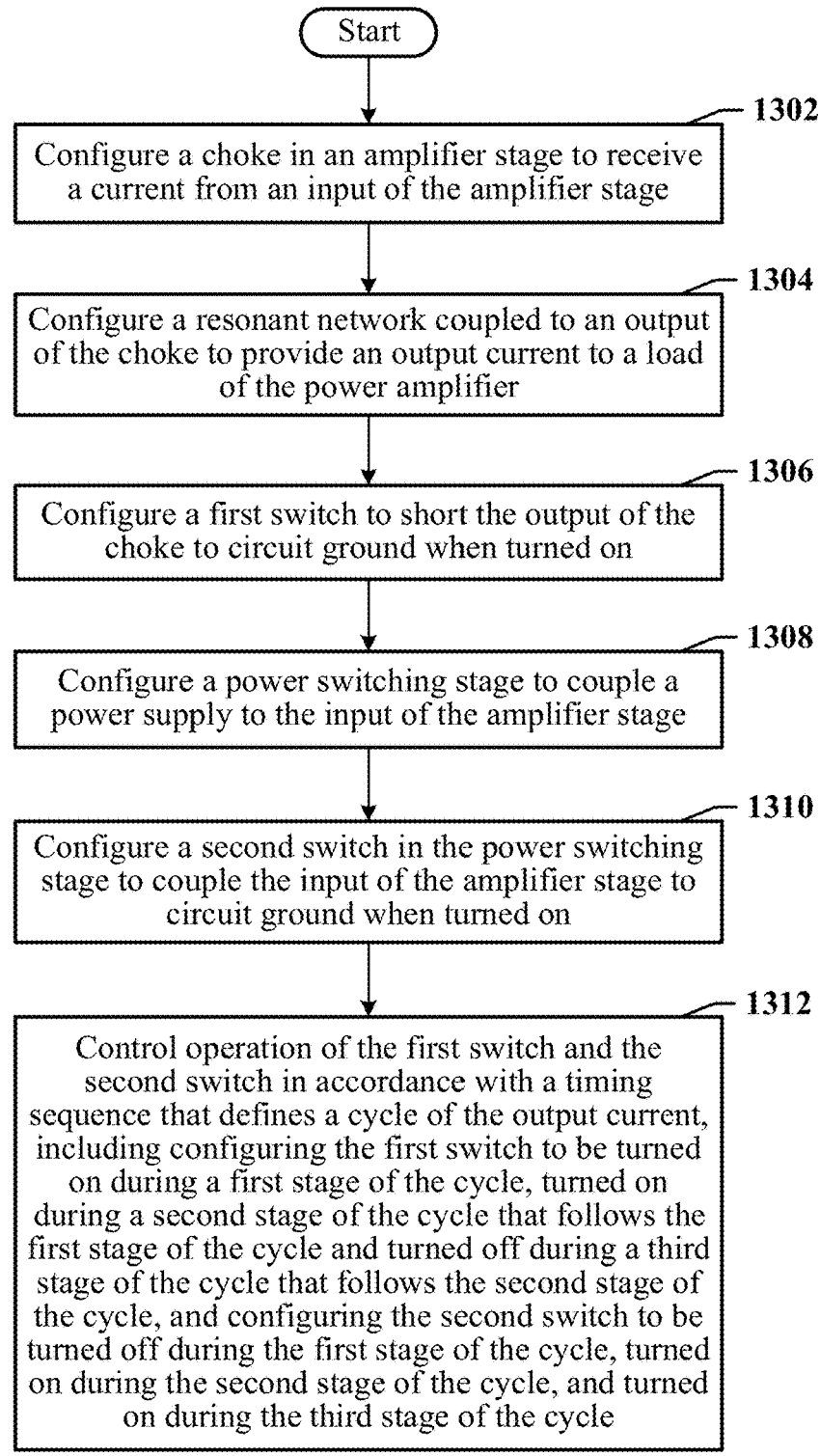
FIG. 13 illustrates a method for amplifying power in a charging device in accordance with certain aspects of this disclosure.

FIG. 13 is a flowchart 1300 illustrating a method for providing an amplified current, voltage or power in a charging device in accordance with certain aspects of this disclosure. The method may be performed by a controller in the charging device. At block 1302, the controller may configure a choke an amplifier stage to receive a current from an input of the amplifier stage. At block 1304, the controller may configure a resonant network coupled to an output of the choke to provide an output current to a load of the charging device. At block 1306, the controller may configure a first switch to short the output of the choke to circuit ground when turned on. At block 1308, the controller may configure a power switching stage to couple a power supply to the input of the amplifier stage. At block 1310, the controller may configure a second switch in the power switching stage to couple the input of the amplifier stage to circuit ground when turned on. At block 1312, the controller may control operation of the first switch and the second switch in accordance with a timing sequence that defines a cycle of the output current. Controlling operation of the first switch may include configuring the first switch such that it is turned on during a first stage of the cycle, turned off during a second stage of the cycle that follows the first stage of the cycle and turned off during a third stage of the cycle that follows the second stage of the cycle. Controlling operation of the second switch may include configuring the second switch such that it is turned off during the first stage of the cycle, turned on during the second stage of the cycle, and turned on during the third stage of the cycle. In one example, a duration of the timing sequence corresponds to a period of the cycle of the output current.

In one aspect, the controller may configure a diode in the power switching stage to provide a coupling between the power supply and the input of the amplifier stage. In another aspect, the controller may configure a third switch in the power switching stage to provide a coupling between the power supply and the input of the amplifier stage. The controller may control operation of the third switch in accordance with the timing sequence. The controller may configure the third switch to be turned on during the first stage of the cycle, turned off during the second stage of the cycle, and turned off during the third stage of the cycle. The controller may configure the third switch to be turned on when the second switch is turned off. The controller may configure the charging device to control power level provided to an output of the charging device. The power level can be controlled using a variable duty cycle of the control signals provided to control operation of the second switch and the third switch. For example, power can be increased by adjusting the duty cycle toward 100%.

In one example, the controller may configure a second choke provided in a second amplifier stage to receive a current from an input of the amplifier stage, configure a fourth switch to short the output of the second choke to circuit ground when turned on, configure the power switching stage to couple a power supply to the input of the second amplifier stage, and control operation of the fourth switch in accordance with the timing sequence that defines the cycle of the output current. The operation of the fourth switch may be controlled by providing a first signal to a gate of the first switch and providing a second signal to a gate of the fourth switch. In one example, the second signal is 180° out of phase with the first signal. In other examples, the phase difference between the first signal and the second signal may be more or less than 180°.

In various examples, an output of the power amplifier is coupled to a transmitting coil of a wireless charging device. In the latter and in other examples, the load of the power amplifier may include one or more transmitting coils of a multi-device wireless charging device.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A power amplifier, comprising:
   an amplifier stage comprising:
      a choke configured to receive a current from an input of the amplifier stage;
      a resonant network coupled to an output of the choke and configured to provide an output current to a load of the power amplifier; and
      a first switch configured to short the output of the choke to circuit ground when turned on;
   a power switching stage configured to couple a power supply to the input of the amplifier stage and comprising a second switch operable to couple the input of the amplifier stage to circuit ground when turned on; and
   a controller configured to control operation of the first switch and the second switch in accordance with a timing sequence that defines a cycle of the output current,
   wherein the first switch is turned on during a first stage of the cycle, turned on during a second stage of the cycle that follows the first stage of the cycle and turned off during a third stage of the cycle that follows the second stage of the cycle, and
   wherein the second switch is turned off during the first stage of the cycle, turned on during the second stage of the cycle, and turned on during the third stage of the cycle.

2. The power amplifier of claim 1, wherein a duration of the timing sequence corresponds to a period of the cycle of the output current.

3. The power amplifier of claim 1, wherein the power switching stage further comprises a diode that provides a coupling between the power supply and the input of the amplifier stage.

4. The power amplifier of claim 1, wherein the power switching stage further comprises a third switch that provides a coupling between the power supply and the input of the amplifier stage when turned on, and wherein the controller is further configured to control operation of the third switch.

5. The power amplifier of claim 4, wherein the third switch is turned on during the first stage of the cycle and turned off during the second stage of the cycle and during the third stage of the cycle.

6. The power amplifier of claim 4, wherein the third switch is turned on when the second switch is turned off.

7. The power amplifier of claim 6, wherein the controller is further configured to:
   control power level provided to an output of the power amplifier, wherein power level is controlled using a variable duty cycle of control signals provided to control operation of the second switch and the third switch.

8. The power amplifier of claim 1, wherein an output of the power amplifier is coupled to a transmitting coil of a wireless charging device.

9. The power amplifier of claim 1, wherein the load of the power amplifier includes one or more transmitting coils of a multi-device wireless charging device.

10. The power amplifier of claim 1, further comprising:
a second amplifier stage comprising:
  a second choke configured to receive a current from an input of the amplifier stage; and
  a fourth switch configured to short the output of the second choke to circuit ground when turned on,
wherein the controller is configured to control operation of the fourth switch in accordance with the timing sequence that defines a cycle of the output current, and
wherein the controller is configured to provide a control signal to the fourth switch that is 180° out of phase with a control signal provided to the first switch.

11. A method for amplifying power in a charging device, comprising:
configuring a choke in an amplifier stage to receive a current from an input of the amplifier stage;
configuring a resonant network coupled to an output of the choke to provide an output current to a load of the charging device;
configuring a first switch to short the output of the choke to circuit ground when turned on;
configuring a power switching stage to couple a power supply to the input of the amplifier stage;
configuring a second switch in the power switching stage to couple the input of the amplifier stage to circuit ground when turned on; and
controlling operation of the first switch and the second switch in accordance with a timing sequence that defines a cycle of the output current, including:
  configuring the first switch to be turned on during a first stage of the cycle, turned on during a second stage of the cycle that follows the first stage of the cycle and turned off during a third stage of the cycle that follows the second stage of the cycle, and
  configuring the second switch to be turned off during the first stage of the cycle, turned on during the second stage of the cycle, and turned on during the third stage of the cycle.

12. The method of claim 11, wherein a duration of the timing sequence corresponds to a period of the cycle of the output current.

13. The method of claim 11, further comprising:
configuring a diode in the power switching stage to provide a coupling between the power supply and the input of the amplifier stage.

14. The method of claim 11, further comprising:
configuring a third switch in the power switching stage to provide a coupling between the power supply and the input of the amplifier stage; and
controlling operation of the third switch in accordance with the timing sequence.

15. The method of claim 14, further comprising:
configuring the third switch to be turned on during the first stage of the cycle, turned off during the second stage of the cycle, and turned off during the third stage of the cycle.

16. The method of claim 14, further comprising:
configuring the third switch to be turned on when the second switch is turned off.

17. The method of claim 16, further comprising:
configuring the charging device to control power level provided to an output of the charging device, wherein power level is controlled using a variable duty cycle of control signals provided to control operation of the second switch and the third switch.

18. The method of claim 11, wherein an output of the charging device is coupled to a transmitting coil of a wireless charging device.

19. The method of claim 11, wherein the load of the charging device includes one or more transmitting coils of a multi-device wireless charging device.

20. The method of claim 11, further comprising:
configuring a second choke provided in a second amplifier stage to receive a current from an input of the amplifier stage;
configuring a fourth switch to short the output of the second choke to circuit ground when turned on;
configuring the power switching stage to couple a power supply to the input of the second amplifier stage; and
controlling operation of the fourth switch in accordance with the timing sequence that defines the cycle of the output current, including providing a first signal to a gate of the first switch and providing a second signal to a gate of the fourth switch wherein the second signal is 180° out of phase with the first signal.

* * * * *